United States Patent
Hase et al.

(10) Patent No.: US 6,286,526 B1
(45) Date of Patent: Sep. 11, 2001

(54) METHOD FOR TREATMENT OF SEMICONDUCTOR SUBSTRATE WITH CHEMICAL SOLUTION AND APPARATUS USED FOR SAID TREATMENT

(75) Inventors: Ushio Hase; Kenichi Yamamoto; Akinobu Nakamura, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/203,371

(22) Filed: Dec. 2, 1998

(30) Foreign Application Priority Data

Dec. 3, 1997 (JP) .................................................. 9-332982
Mar. 17, 1998 (JP) ................................................ 10-067433

(51) Int. Cl.⁷ .................................................. B08B 3/04
(52) U.S. Cl. ........................ 134/100.1; 134/111; 134/113
(58) Field of Search ................................ 134/100.1, 111, 134/113, 56 R, 57 R

(56) References Cited

U.S. PATENT DOCUMENTS

| 5,364,510 | 11/1994 | Carpio | 204/153.1 |
|---|---|---|---|
| 5,439,569 | 8/1995 | Carpio | 204/153.1 |
| 5,472,516 | 12/1995 | Hanson et al. | 134/18 |
| 5,520,205 | * 5/1996 | Guldi et al. | 134/98.1 |
| 5,578,273 | 11/1996 | Hanson et al. | 422/110 |
| 5,746,233 | * 5/1998 | Kuroda et al. | 134/57 R |
| 5,873,381 | * 2/1999 | Han | 134/182 |
| 5,887,604 | * 3/1999 | Murakami et al. | 134/102.2 |
| 6,109,278 | * 8/2000 | Shindo et al. | 134/56 R |
| 6,158,447 | * 12/2000 | Kamikawa et al. | 134/56 R |

FOREIGN PATENT DOCUMENTS

| 4-278529 | 10/1992 | (JP) . |
|---|---|---|
| 5-259141 | 10/1993 | (JP) . |
| 7-99175 | 4/1995 | (JP) . |
| 7-142435 | 6/1995 | (JP) . |
| 8-22972 | 1/1996 | (JP) . |

* cited by examiner

*Primary Examiner*—Randy Gulakowski
*Assistant Examiner*—Saeed T. Chaudhry
(74) *Attorney, Agent, or Firm*—Sughrue, Mion, Zinn, Macpeak & Seas, PLLC

(57) ABSTRACT

The concentrations of predetermined components of a chemical solution 5 present in a cleaning bath 1 are measured by a measurement unit 11. From the results are calculated the concentrations of various chemical species. From the concentrations calculated and an experimentally obtained rate equation is calculated the treating ability of the chemical solution 5 before supplementation of said components. Then, the treating abilities of chemical solution when the components and ultrapure water are supplemented, are calculated for various cases of amounts supplemented. From these cases is determined a case of amounts supplemented in which the treating ability of chemical solution is maintained at a required level and the amounts supplemented are minimized. Next, the components and ultrapure water are supplemented in respective determined amounts via feeding pumps 21, 23 and 25.

4 Claims, 10 Drawing Sheets

- upper limit
- standard level
- lower limit
- waste water

METHOD FOR TREATMENT OF SEMICONDUCTOR SUBSTRATE WITH CHEMICAL SOLUTION AND APPARATUS USED FOR SAID TREATMENT

BACKGROUND OF THE INVENTION

1. Field of the Invention

The present invention relates to a method for treatment with chemical solution and an apparatus for treatment with chemical solution, both used for etching or cleaning of semiconductor substrate in the process for production of semiconductor device or the like.

2. Description of the Related Art

When a semiconductor substrate is cleaned in the cleaning bath of a cleaning apparatus by a representative method using a mixed chemical solution of ammonia and hydrogen peroxide, the semiconductor substrate is cleaned at 60 to 80° C., and the concentration of each component of the chemical solution in the cleaning bath decreases owing to the vaporization, decomposition, etc. of the component and changes with the lapse of time.

In a conventional cleaning method using a cleaning apparatus of FIG. 9, aqueous ammonia, hydrogen peroxide and pure water are fed, in necessary amounts, into a cleaning bath 101 from a storage tank 105 for aqueous ammonia, a storage tank for hydrogen peroxide and a storage tank for pure water, by the driving of solution-feeding pumps 108, 109 and 110; and a semiconductor substrate (not shown in FIG. 9) is cleaned with the resulting mixed chemical solution in the cleaning bath 101. The aqueous ammonia and the hydrogen peroxide are automatically supplemented into the cleaning bath 101 by given amounts at given time intervals.

In the above cleaning method, however, it is difficult to control the concentration of each component of the mixed chemical solution in the cleaning bath 101, at a constant level and, unless the automatic supplementation is optimized, the concentration of each component of mixed chemical solution changes largely with time and a large variation in said concentration takes place.

In Japanese Patent Application Kokai (Laid-Open) No. 278529/1992 is disclosed a cleaning apparatus as shown in FIG. 10, for keeping constant the concentration of each component of cleaning solution in cleaning bath. In the apparatus, a cleaning bath 151 is provided with an ammonia component analyzer 161 for measuring the concentration of ammonia and a hydrogen peroxide component analyzer 162 for measuring the concentration of hydrogen peroxide, and the concentrations of ammonia and hydrogen peroxide in the cleaning bath 151 are independently monitored by the analyzers 161 and 162 via a filter 154, a solution-feeding pump 153 and valves 163 and 164. A valve 155a connected to the storage tank 155 for ammonia and a valve 156a connected to the storage tank 156 for hydrogen peroxide are operated based on the signals sent from the analyzer 161 and the analyzer 162, respectively; thereby, the chemical component(s) whose concentration(s) in cleaning bath has (have) decreased, is (are) supplemented automatically and the concentrations of chemical components in cleaning bath are kept constant. Since the decrease in concentration of hydrogen peroxide is generally small as compared with the decrease in concentration of ammonia (caused by vaporization or the like), there is disclosed, in Japanese Patent Application Kokai (Laid-Open) No. 259141/1993, a cleaning method wherein only aqueous ammonia is supplemented depending upon the temperature used in cleaning and no hydrogen peroxide solution is supplemented. Further in Japanese Patent Application Kokai (Laid-Open) No. 142435/1995 are disclosed a cleaning method wherein cleaning is conducted in a concentration range at which the variation of etching rate relative to the variation of ammonia concentration is small, and a combination method thereof with the above-mentioned method of controlling the concentration of cleaning solution by the measurement of the concentration of each component of cleaning solution or with the above-mentioned method of supplementing only ammonia. Furthermore in Japanese Patent Application Kokai (Laid-Open) No. 22972/1996 is disclosed a cleaning method wherein the concentrations of hydrogen peroxide and ammonia are controlled at desired levels based on, for example, two parameters of cleaning solution, i.e. conductivity and pH.

The above techniques, however, had the following common problems.

When a mixed chemical solution of ammonia and hydrogen peroxide is used, there are present, in its fresh solution, various chemical species such as $NH_3$, $NH_4^+$, $H_2O_2$, $HO_2^-$, $H^+$, $OH^-$, $H_2O$ and the like. In the solution which is being used for cleaning of Si semiconductor substrate, there are further present contaminants on semiconductor substrate and chemical species resulting from reactions between said contaminants and the components of chemical solution. Therefore, the cleaning ability of chemical solution during cleaning is determined by, for example, the concentrations of said chemical species, the reaction rates and free energies of the reactions of said chemical species, the temperature level of cleaning and the uniformity of concentrations of said chemical species in cleaning bath.

In any of the above-mentioned conventional techniques, only the concentrations of components in chemical solution were controlled and no control was made on the above-mentioned parameters for determining the cleaning ability of chemical solution, particularly the concentrations of dissolved chemical species and the reactions of dissolved chemical species. Thus, no control was made on the cleaning ability per se of chemical solution and it was impossible to efficiently conduct high-level control over cleaning of semiconductor substrate. Further, higher standards are being required for cleaning of semiconductor and the consciousness for environmental protection is increasing; in this connection, the demand for use of smaller amount of chemical solution has increased in recent years. The above-mentioned conventional techniques are not fully satisfactory for these requirement and demand.

For example, in the technique of Japanese Patent Application Kokai (Laid-Open) No. 278529/1992, when a chemical component large in concentration variation due to vaporization and/or decomposition is supplemented for maintenance of its concentration, the supplementation causes the dilution of other chemical component; as a result, the other chemical component must be supplemented as well. Consequently, the total amount of the chemical components supplemented into cleaning bath becomes large. That is, in order to keep the concentrations of chemical components at respective constant levels, it is necessary not only to conduct strict concentration control but also to supplement the chemical components in a large total amount. Meanwhile, the methods disclosed in Japanese Patent Application Kokai (Laid-Open) No. 259141/1993 and Japanese Patent Application Rokai (Laid-Open) No. 142435/1995 are applicable only under certain cleaning conditions and, depending upon the kind of material to be cleaned, make difficult the cleaning under said cleaning conditions.

The method disclosed in Japanese Patent Application Kokai (Laid-Open) No. 22972/1996 had similar problems as well because it controls the concentrations of hydrogen peroxide and ammonium hydroxide in chemical solution at desired levels. For example, when a component in chemical solution vaporized in a relatively large amount, there were cases that the component had to be supplemented in an amount unnecessarily larger than actually needed. The composition of chemical solution capable of giving a certain etching rate (surface-treating ability or chemical solution's cleaning ability) is not restricted to one particular composition and includes various compositions. Therefore, when the composition of chemical solution has shown a change, it is more efficient to conduct supplementation of chemical component(s) so that the composition after supplementation is close to the current composition and shows an etching rate (surface-treating ability or chemical solution s cleaning ability) closest to the initial etching rate, rather than to conduct the supplementation so as to regain the initial composition of chemical solution. This supplementation mode can reduce the cost for supplementation; moreover, the mode can shorten the time needed for supplementation and therefore the problem associated with the variation in composition of chemical solution during supplementation can be avoided. Thus, in the methods wherein the component concentrations in chemical solution are kept constant, there are cases that chemical components must be supplemented in amounts larger than actually needed; therefore, the methods had room for improvement in that respect.

In p. 719, 29p-E-14 of No. 2 of Extended Abstracts (The 44th Spring Meeting, 1997); The Japan Society of Applied Physics and Related Societies is presented a method (by the presenters including the present inventor) for predicting the etching rate of wafer surface when subjected to cleaning with ammonia-hydrogen peroxide solution, from the analysis of chemical equilibrium and subsequent analysis of etching reaction and also from the cleaning conditions used.

When such a method for prediction of etching rate is applied to control of chemical solution, the surface-treating ability of chemical solution, i.e. etching rate per se is controlled. Therefore, the method, as compared with conventional methods wherein the component concentrations in chemical solution are kept constant, makes possible more strict and more efficient control of chemical solution. In actual application of the method for prediction of etching rate, to control of chemical solution, however, it is the most important task how to efficiently determine, based on the method for prediction of etching rate, the optimum supplementation amounts of chemical components. That is, a means is required which can rapidly and accurately determine the optimum supplementation amounts of the components contained in chemical solution and effective for surface treatment. It is also a problem to solve how to determine the range of supplementable amounts of chemical components in relation to the constitution of the apparatus used and how to determine the actual amount of each chemical component supplemented, within said range of supplementable amounts. Further, in the method for prediction of etching rate, presented in the above Extended Abstracts, etching rate is expressed by a formula including, as the variables, the $OH^-$ concentration in chemical solution and the temperature of treating; therefore, an experimental formula must be prepared each time when the conditions of surface treating, the conditions of substrate surface, etc. vary; thus, the method had room for improvement with respect to the accuracy of prediction of etching rate and the applicability of the method.

SUMMARY OF THE INVENTION

In order to solve the above problems, the present invention provides:

a method for treatment of semiconductor substrate with chemical solution, which comprises immersing a semiconductor substrate in a chemical solution to conduct the surface treatment of the semiconductor substrate and, during the surface treatment, supplementing one or more predetermined components contained in the chemical solution, effective for the surface treatment, to maintain the surface-treating ability of the chemical solution, wherein the supplementation of the predetermined components are conducted according to the following steps (A) to (C):

(A) a step of measuring the current level of the chemical solution present in a cleaning bath and, from the measured current solution level, a predetermined standard solution level, a predetermined upper limit of solution level and a predetermined lower limit of solution level, determining a range of supplementable amounts of the predetermined components and ultrapure water which is also one component of the chemical solution, (B) a step of measuring the temperature of the chemical solution present in the cleaning bath and the concentrations, activities or relevant physical parameters of the predetermined components or chemical species contained in said chemical solution and effective for the surface treatment, and (C) a step of calculating the surface-treating ability of the chemical solution present in the cleaning bath, from the values obtained in the step (B) and an experimentally obtained formula expressing the surface-treating ability of chemical solution, and conducting the supplementation of the predetermined components so that the calculated surface-treating ability falls in a predetermined range and further so that the amounts of supplementation fall in the range of supplementable amounts determined in the step (A).

In the present invention, control of the chemical solution used for the surface treatment of semiconductor substrate is conducted by controlling the surface-treating ability of the chemical solution. As the indicator for the surface-treating ability of the chemical solution, there is used, for example, the etching rate of semiconductor substrate. In the present invention, the predetermined components of chemical solution are supplemented so that the surface-treating ability of the chemical solution falls in a predetermined range. This predetermined range refers to a given allowable range in which a desired level of the surface-treating ability is at the center. The supplementation of the predetermined components may be conducted intermittently or continuously.

A flow chart of an example of the above method for treatment of semiconductor substrate with chemical solution is shown in FIG. 11. In this example, the composition of chemical solution which changes incessantly, is monitored and an etching rate corresponding to the obtained composition is calculated by chemical equilibrium analysis. When the calculated etching rate has deviated from a predetermined allowable range, first, small amounts of the predetermined components of chemical solution are supplemented to the chemical solution, and then a surface-treating ability, i.e. etching rate after supplementation is calculated. This supplementation of small amounts of the components is continued until the calculated etching rate after supplementation falls in its allowable range. The supplementation of small amounts of the components is conducted in a predetermined range of supplementable amounts.

According to the present invention, there is also provided:

a method for treatment of semiconductor substrate with chemical solution, which comprises immersing a semiconductor substrate in a chemical solution to conduct the surface treatment of the semiconductor substrate and, during the surface treatment, supplementing one or more predetermined components contained in the chemical solution, effective for the surface treatment, to maintain the surface-treating ability of the chemical solution, wherein the supplementation of the predetermined components are conducted according to the following steps (A) to (C):

(A) a step of measuring the current level of the chemical solution present in a cleaning bath and, from the measured current solution level, a predetermined standard solution level, a predetermined upper limit of solution level and a predetermined lower limit of solution level, determining a range of supplementable amounts of the predetermined components and ultrapure water which is also one component of the chemical solution, (B) a step of measuring the temperature of the chemical solution present in the cleaning bath and the concentrations, activities or relevant physical parameters of the predetermined components or chemical species contained in said chemical solution and effective for the surface treatment, and (C) a step of selecting, within the range of supplementable amounts determined in the step (A), various combinations of amounts of the predetermined components supplemented, calculating, for each combination, a surface-treating ability after supplementation from the values obtained in the step (B) and an experimentally obtained formula expressing the surface-treating ability of chemical solution, comparing the thus-calculated surface-treating abilities to select the most preferred combination of component amounts supplemented, and conducting the supplementation of the predetermined components based on the selected combination of component amounts supplemented.

A flow chart of an example of the above method for treatment of semiconductor substrate with chemical solution is shown in FIG. 12. In this example, the composition of chemical solution which changes incessantly, is monitored and an etching rate corresponding to the obtained composition is calculated by chemical equilibrium analysis. When the calculated etching rate has deviated from a predetermined allowable range, various combinations of amounts of solution components supplemented are selected within a predetermined range of supplementable amounts of solution components. "Combination of amounts of solution components supplemented" refers, when the chemical solution contains, for example, ammonia and hydrogen peroxide as the effective components, to a combination of the amount of ammonia supplemented and the amount of hydrogen peroxide supplemented. Several such combinations are selected so that the total of the amounts of solution components supplemented, of each combination falls in the predetermined range of supplementable amounts of solution components. For each combination, an etching rate after supplementation is calculated. The combination which gives a calculated etching rate closest to a predetermined value, is selected as the most preferred combination of amounts of solution components supplemented. Based on this selected combination, the predetermined components of chemical solution are supplemented. Like above, as the most preferred combination of amounts of solution components supplemented, there can be selected a combination which gives a calculated etching rate closest to the predetermined value; alternatively, the most preferred combination may be determined by taking into account, for example, two matters, i.e. (1) the etching rate after supplementation is close to the predetermined value and (2) the amounts of solution components supplemented are small.

According to the present invention, there is also provided:

a method for treatment of semiconductor substrate with chemical solution, which comprises immersing a semiconductor substrate in a chemical solution to conduct the surface treatment of the semiconductor substrate and, during the surface treatment, supplementing one or more predetermined components contained in the chemical solution, effective for the surface treatment, to maintain the surface-treating ability of the chemical solution, wherein the supplementation of the predetermined components are conducted by carrying out the following steps (A) to (C), then repeating the following step (D) given times, and carrying out the following step (E):

(A) a step of measuring the current level of the chemical solution present in a cleaning bath and, from the measured current solution level, a predetermined standard solution level, a predetermined upper limit of solution level and a predetermined lower limit of solution level, determining a range of supplementable amounts of the predetermined components and ultrapure water which is also one component of the chemical solution, (B) a step of measuring the temperature of the chemical solution present in the cleaning bath and the concentrations, activities or relevant physical parameters of the predetermined components or chemical species contained in said chemical solution and effective for the surface treatment, (C) a step of selecting, within the range of supplementable amounts determined in the step (A), various combinations of amounts of the predetermined components supplemented, calculating, for each combination, a surface-treating ability after supplementation from the values obtained in the step (B) and an experimentally obtained formula expressing the surface-treating ability of chemical solution, and comparing the thus-calculated surface-treating abilities to select the most preferred combination of component amounts supplemented, (D) selecting two or more combinations of component amounts supplemented so that they fall in a range predetermined in such a way that the most preferred combination of-component amounts supplemented, selected in the step (C) is at the center of the range, calculating, for each combination, a surface-treating ability after supplementation from an experimentally obtained formula expressing the surface-treating ability of chemical solution, and comparing the thus-calculated surface-treating abilities to select the most preferred combination of component amounts supplemented, and (E) conducting the supplementation of the predetermined components based on the combination of component amounts supplemented, selected in the step (D).

Part of the flow chart of an example of the above method for treatment of semiconductor substrate with chemical solution is shown in FIG. 13. The example is partially common to the method for treatment of semiconductor substrate with chemical solution, shown in FIG. 12; however, the example is different therefrom in the way of selecting the most preferred combination of amounts of solution components supplemented. Specifically, the example is different in the steps after the most preferred combination of amounts of solution components supplemented has been selected from within the range of supplementable amounts of solution components. In FIG. 13, it is shown how to rapidly and accurately determine the optimum amounts of solution components supplemented, from within the range of supplementable amounts of solution components, based on the predicted etching rate. The detail of determination of the optimum amounts of-solution components supplemented is described later.

According to the above second and third methods for treatment of semiconductor substrate with chemical solution, predicted etching rate can be effectively utilized, whereby the combination of amounts of solution components supplemented can be determined rapidly and accurately.

In any of the above three methods for treatment of semiconductor substrate with chemical solution, the chemical solution is an alkaline solution containing hydrogen peroxide and the formula expressing the surface-treating ability of chemical solution includes, as the variables, the concentration or activity of hydroxide ion ($OH^-$) and the concentration or activity of the dissociated ion ($HO_2^-$) of hydrogen peroxide. Here, the pH of the chemical solution is preferably 8 to 12, more preferably 9 to 11. With such a pH range, a certain desired etching rate can be secured while the surface roughening of semiconductor substrate after treatment with chemical solution is prevented.

In the above second and third methods for treatment of semiconductor substrate with chemical solution, the most preferred combination of component amounts supplemented is preferably selected so that the surface-treating ability after supplementation becomes closest to a desired surface-treating ability.

In the above second and third methods for treatment of semiconductor substrate with chemical solution, the most preferred combination of component amounts supplemented is preferably selected by considering that (1) the surface-treating ability after supplementation becomes close to a desired surface-treating ability and (2) the component amounts supplemented are minimized. That is, by taking into account that the surface-treating ability after supplementation becomes close to a desired surface-treating ability and further that the component amounts supplemented are minimized, and then by adding necessary weights to the above two matters, the most preferred combination of component amounts supplemented is selected. Thereby, the surface-treating ability of chemical solution can be maintained at a satisfactory level while the component amounts supplemented are minimized.

According to the present invention, there is also provided:
   an apparatus for surface treatment of semiconductor substrate with chemical solution, used for carrying out the above methods, which has:
   a measurement unit for intermittently or continuously measuring (1) the temperature of the chemical solution present in a cleaning bath and (2) the concentrations of components in the chemical solution, or the concentrations or activities of chemical species in the chemical solution, or the activity-related physical parameters of chemical species in the chemical solution, and
   a control unit having (1) a function of calculating the surface-treating ability of the chemical solution in the cleaning bath, from the data obtained by the measurement unit and from an experimentally obtained formula expressing the surface-treating ability of chemical solution, (2) a function of determining the amount of chemical solution to be supplemented, based on the surfacetreating ability calculated in the above (1), and (3) a function of controlling the amounts of predetermined components supplemented, based on the amount of chemical solution to be supplemented, determined in the above (2).

With this apparatus, very accurate and efficient treatment of semiconductor substrate with chemical solution becomes possible, and improvements in yield and reliability of semiconductor device can be expected.

According to the present invention, there is also provided:
   an apparatus for surface treatment of semiconductor substrate with chemical solution, having:
      a cleaning bath in which a semiconductor substrate is placed and treated with a chemical solution, and
      an overflow bath provided so as to surround the cleaning bath,
   wherein the overflow bath has a circulating bath and a mixing bath; the circulating bath communicates with a first circulating pump; the mixing bath is fitted with pipes for feeding the predetermined components of chemical solution effective for surface treatment and also fitted with a pipe for feeding ultrapure water; the mixing bath communicates with a second circulating pump; a filter for removal of fine particles is provided downstream of a site at which the outlet side of the first circulating pump and the outlet side of the second circulating pump merge; and the first circulating pump and the second circulating pump feed the predetermined components of chemical solution into the cleaning bath.

With this apparatus, stable cleaning ability (surface-treating ability) is obtained and the amount of chemical solution used can be decreased. The mixing bath is preferably provided with a stirrer, because it can reduce the nonuniformity of chemical solution concentration in mixing bath.

Any of the above apparatuses for surface treatment of semiconductor substrate with chemical solution, preferably has: a unit for measuring the components causing the deterioration of the chemical solution, and
   a means for determining the timing of the total change of the chemical solution based on the result of the measurement made by the unit. The components causing the deterioration of the chemical solution refer to, for example, metal impurities, organic compounds and fine particles. With the unit and means, improvements in yield and reliability of product can be expected.

The above unit can be, for example, a unit for measuring metal concentrations, a unit for measuring fine particles or a unit for measuring carbon amount.

According to the present methods and apparatuses for treatment of semiconductor substrate with chemical solution, the composition of chemical solution, amounts of impurities, etc. in cleaning-bath are measured; by chemical equilibrium analysis using the results of the measurement, the kinds and concentrations of chemical species dissolved in chemical solution are calculated when necessary; based on the calculation results, the surface-treating ability of the chemical solution in cleaning bath is calculated; the result is fed back to control the composition of chemical solution.

Consequently, the reproducibility of treatment of semiconductor substrate with chemical solution can be enhanced, and improvements in yield and reliability of semiconductor device can be expected. Further, it is possible to reduce the change frequency of chemical solution and decrease the amounts of components of chemical solution supplemented. Therefore, not only the cost of chemical solution per se but also the total cost of chemical solution including the disposal cost of chemical solution can be reduced, and reduction in environmental load becomes possible.

Figure 11:
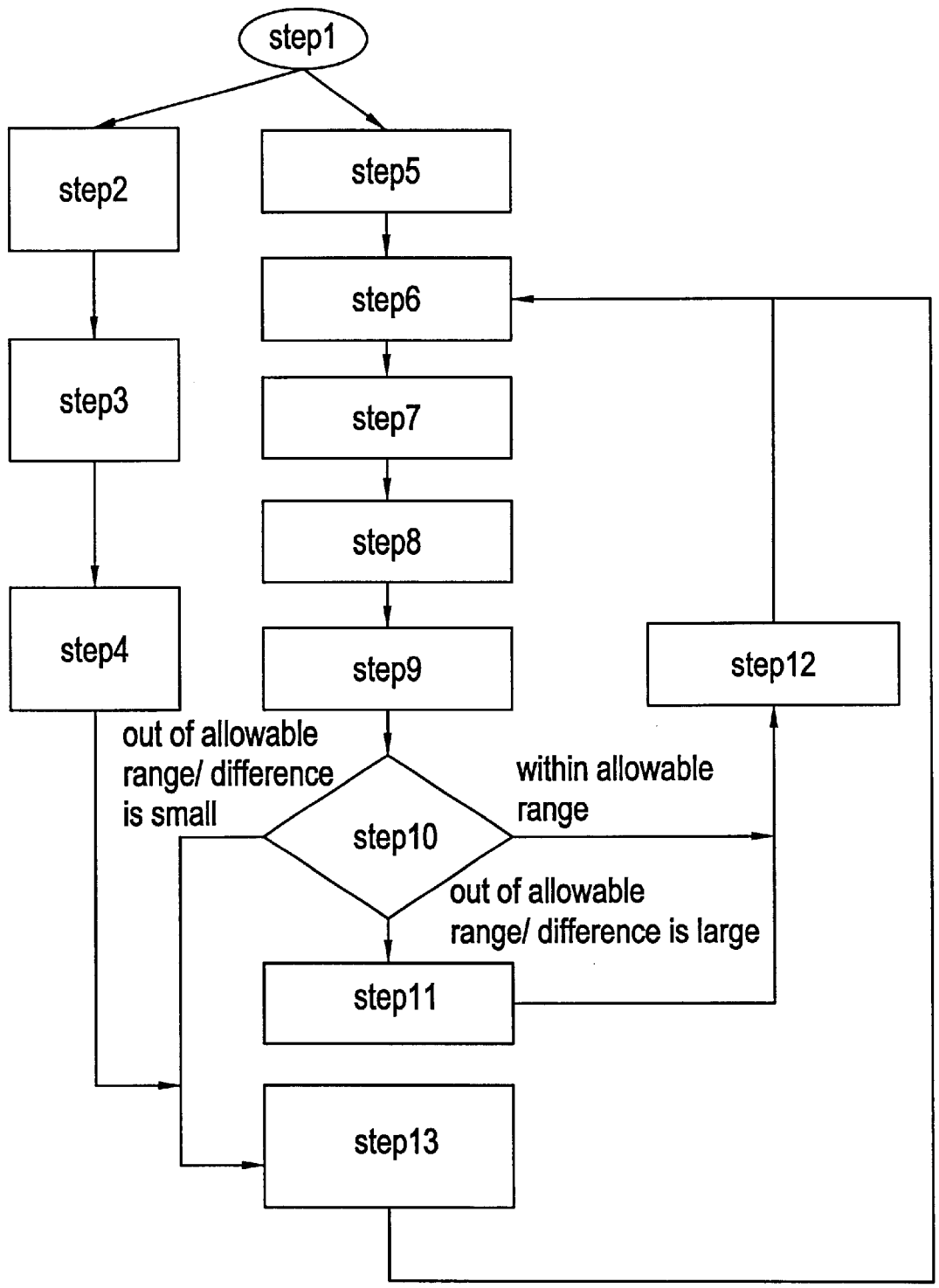
FIG. 11 is a flow chart showing an example of the present method for treatment with chemical solution.
Figure 12:
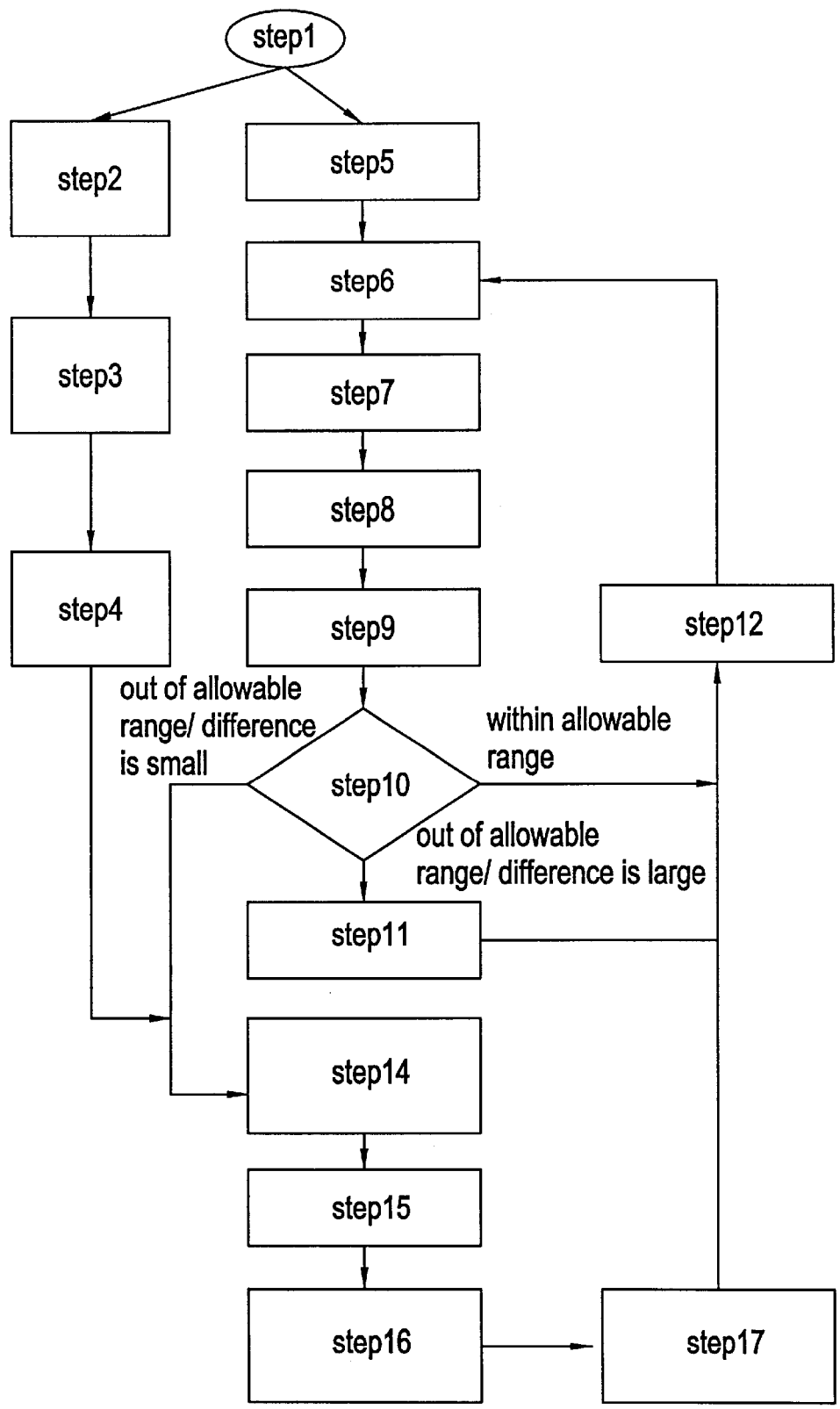
FIG. 12 is a flow chart showing other example of the present method for treatment with chemical solution.
Figure 13:
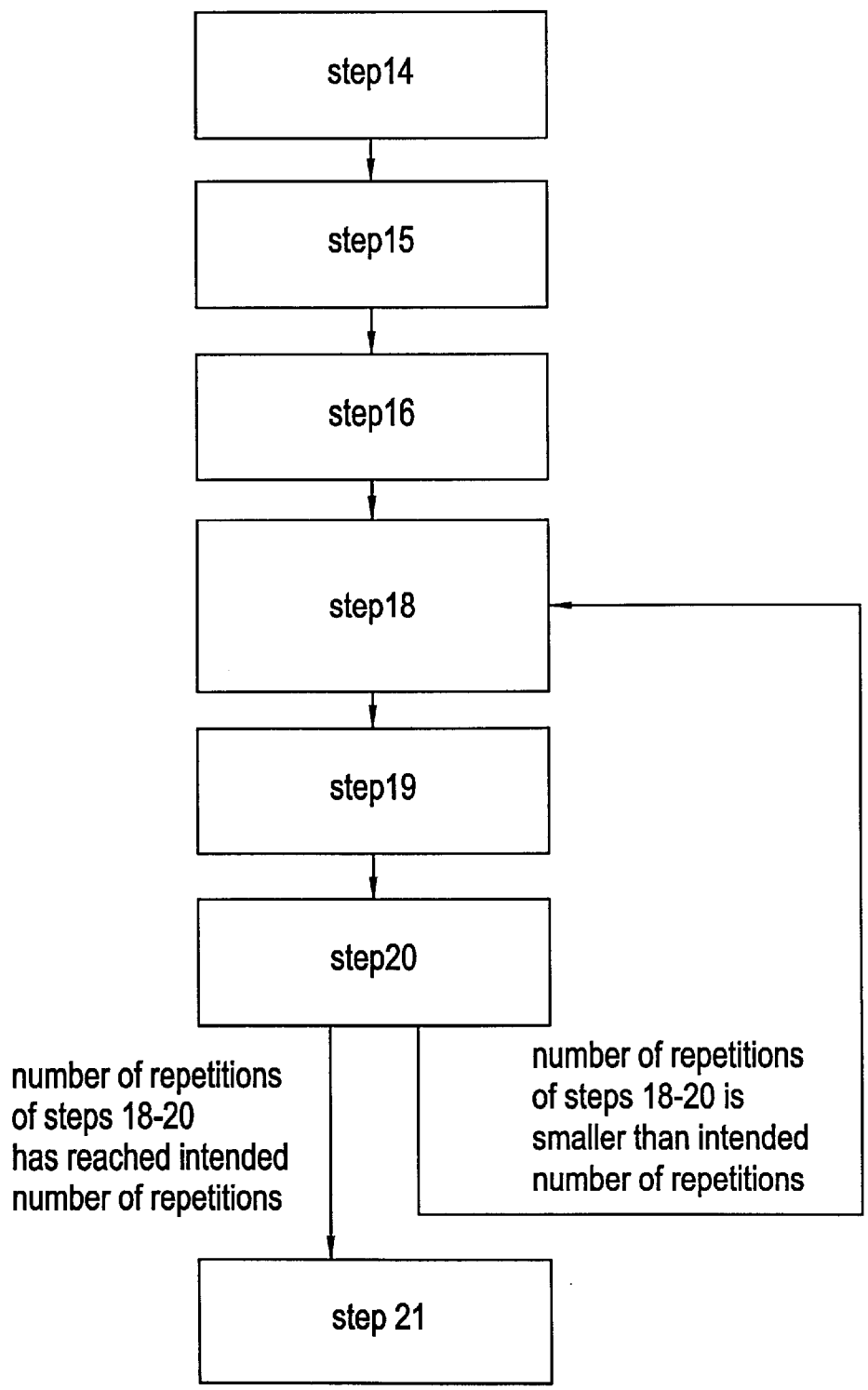
FIG. 13 is a flow chart showing still other example of the present method for treatment with chemical solution.

Steps 1 to 21 described in FIGS. 11–13 are as follows.

Step 1. Start

Step 2. Set the upper limit, lower limit and Standard level of liquid level.

Step 3. Measure the current liquid level of chemical solution.

Step 4. Calculate a range of supplementable component amounts.

Step 5. Set a desired etching rate and its allowable range.

Step 6. Feed trigger signals for measurement to composition monitor and temperature sensor.

Step 7. Input measured values sent from composition monitor and temperature sensor.

Step 8. Calculate the concentrations of chemical species on chemical equilibrium analysis.

Step 9. Calculate an etching rate from given formula.

Step 10. Evaluate the difference between calculated etching rate and desired etching rate.

Step 11. Send a Signal for stoppage of supplementation.

Step 12. Input a Signal for completion of supplementation.

Step 13. Supplement small amounts of required solution components within the range of supplementable amounts.

Step 14. Select various combinations of solution component amounts supplemented, within the range of supplementable amounts.

Step 15. Calculate an etching rate for each combination selected.

Step 16. Compare the calculated etching rates and select the most preferred combination of solution component amounts supplemented.

Step 17. Supplement required solution components based on the most preferred combination of solution component amounts supplemented.

Step 18. Set a predetermined range of solution component amounts supplemented in such a way that the center becomes the selected combination of solution component amounts supplemented, and select various combinations Of solution component amounts supplemented, within the predetermined range.

Step 19. Calculate an etching rate for each combination.

Step 20. Compare the calculated etching rates and select the most preferred combination of solution component amounts supplemented.

Step 21. Supplement required solution components based on the selected solution component amounts supplemented.

DETAILED DESCRIPTION OF THE PREFERRED EMBODIMENTS

In the present invention, as the chemical solution, there can be used a chemical solution generally used for the surface treatment of semiconductor substrate. The chemical solution is, for example, a solution containing ammonia, hydrogen peroxide, etc.

In the present invention, "standard liquid level" refers to a standard liquid level during cleaning of semiconductor substrate. "Lower limit of liquid level" set in the designing of apparatus is a limit liquid level at which the immersion of wafer in chemical solution is complete, and "upper limit of liquid level" set in the designing of apparatus is a limit liquid level at which no overflow of chemical solution takes place when the components of chemical solution are supplemented. In the present invention, however, both "lower limit of liquid level" and "upper limit of liquid level" are levels set for the operation of apparatus; and "lower limit of liquid level" is set between the above "lower limit" set in the designing of apparatus and the standard liquid level, and "upper limit of liquid level" is set between the above "upper limit" set in the designing of apparatus and the standard liquid level. In the present invention, "range of supplementable amounts" refers to a range of amounts supplemented, in which the liquid level of chemical solution after supplementation is higher than the lower limit of liquid level and lower than the upper limit of liquid level.

The upper limit of liquid level and the lower limit of liquid level are appropriately determined in relation to the apparatus used; however, they are preferably determined as follows. The lower limit of liquid level is set to be preferably −10 to −1%, more preferably −5 to −2% of the standard liquid level. When the lower limit of liquid level is smaller than −10%, the variation of composition of chemical solution is large when a particular component in chemical solution decreases due to vaporization or the like, making difficult the control of chemical solution in some cases. When the lower limit of liquid level is larger than −1%, the range of supplementable amounts is small, making difficult the control of chemical solution in some cases. Meanwhile, the upper limit of liquid level is set to be preferably 1 to 10%, more preferably 2 to 5% of the standard liquid level. When the upper limit of liquid level is larger than 10%, the amount of supplementation is large, which may pose a cost problem. When the upper limit of liquid level is smaller than 1%, the range of supplementable amounts is small, making difficult the control of chemical solution in some cases.

In the present invention are measured the concentrations, activities or relevant physical parameters of the predetermined components or predetermined chemical species contained in chemical solution and effective for surface treatment. "Effective for surface treatment" refers to having an ability of etching the surface of semiconductor substrate. "Predetermined components effective for surface treatment" refer to the components contained in chemical solution and effective for the surface treatment of semiconductor substrate, and are, for example, ammonia and hydrogen peroxide. "Predetermined chemical species" refer to said components and the ions formed by dissociation of the components and, when the chemical solution used is, for example, a mixed solution of ammonia and hydrogen peroxide, are $NH_3$, $NH_4^+$, $H_2O_2$, $HO_2^-$, $H^+$, $OH^-$, etc. The concentrations of the predetermined components can be measured by the use of, for example, a commercial monitor for composition of chemical solution. The activities of chemical species can be calculated by chemical equilibrium analysis using the results of measurement of composition of chemical solution, or can be calculated from the data obtained by electrochemical measurement or the like.

In the present invention, the formula expressing the'surface-treating ability of chemical solution preferably includes, as the variables, the concentration or activity of hydroxide ion ($OH^-$) and the concentration or activity of dissociated ion ($HO_2^-$) of hydrogen peroxide. In the method for prediction of etching rate, described in p. 719, 29p-E-14 of No. 2 of Extended Abstracts (The 44th Spring Meeting, 1997); The Japan Society of Applied Physics and Related Societies, it is indicated that etching rate can be expressed by a formula including, as the variables, the $OH^-$ concentration in chemical solution and the temperature of treating. By further adding another variable, i.e. $HO_2^-$, the unique advantages described below are obtained.

Figure 7:
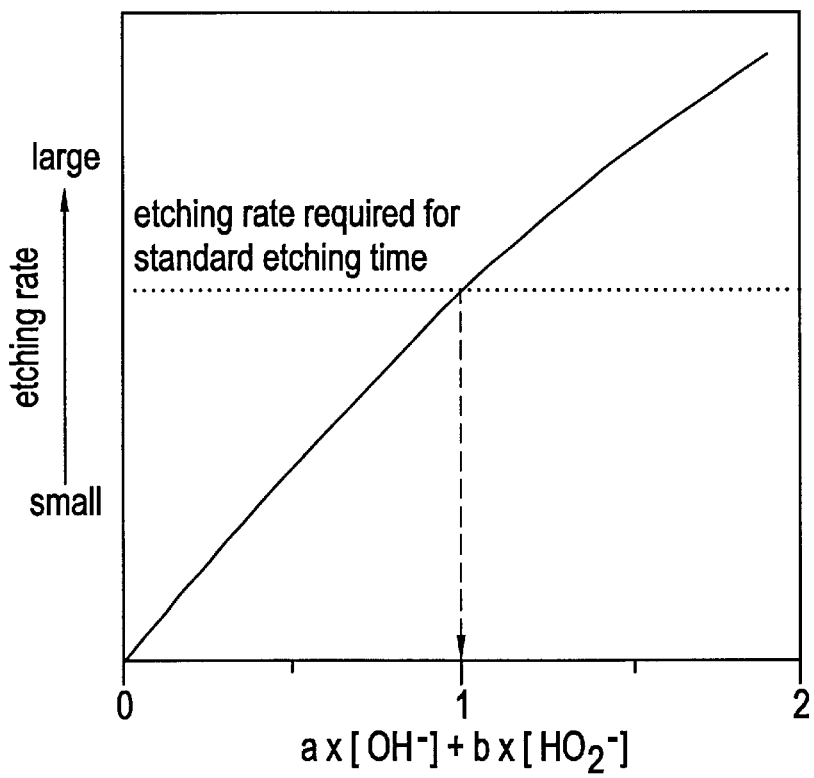
FIG. 7 is a drawing showing a relation of (1) a value which is an indicator of the treating ability of ammonia-hydrogen peroxide mixed solution and (2) the amount of etching of silicon substrate.

As the first advantage, there can be obtained a formula of the relation between concentrations of particular chemical species and etching rate, applicable to various cleaning conditions. In the method appearing in the above Extended Abstracts, it is impossible to express the relation between $OH^-$ concentration and etching rate, by a single formula; when the amount ratio of $H_2O_2$ and $H_2O$ varies greatly, the formula expressing the relation between $OH_-$ concentration and etching rate varies as well; therefore, it was necessary to prepare many experimental formulas for various cleaning conditions. In contrast, when $HO_2^-$ is added as another variable, by creating a new variable of $a\times[OH^-]+b\times[HO_2^-]$ and paying attention to a relation between this parameter and etching rate, a very useful formula can be obtained which is applicable irrespective of the amount ratio of $H_2O_2$ and $H_2O$. FIG. 7 shows the relation. Here, the variables a and b are constants determined by the condition of substrate surface, etc. and can be determined experimentally. "a" and "b" are normalized so that $a\times[OH^-]+b\times[HO_2^-]$ becomes 1 under the conditions capable of giving an etching rate necessary for standard surface treatment.

As the second advantage, a formula can be obtained which is widely applicable to various substrates having different surface conditions. In the method appearing in the above Extended Abstracts, it was difficult in some cases to reliably obtain a formula expressing the relation between $OH^-$ concentration and etching rate, depending upon the kind and surface condition of the substrate used. In contrast, when $HO_2^-$ is added as another variable, a formula of wide applicability can be obtained by determining the variables "a" and "b" experimentally for various surface conditions of substrate. For example, when the etching rate of a thermally formed oxide film is predicted, the effect of the variable "b" is relatively large as described later and, by taking the effect into account, very accurate prediction becomes possible.

(First embodiment)

Next, description is made on the first embodiment of the present invention with reference to drawings.

Figure 1:
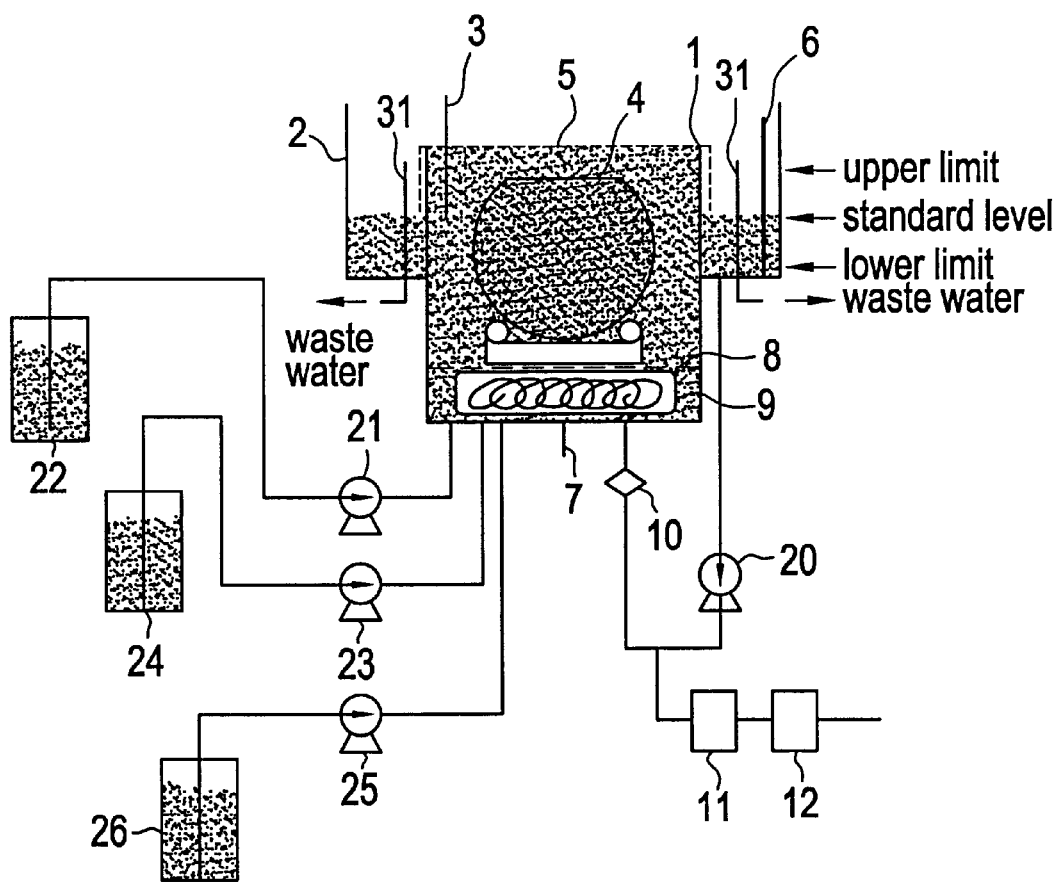
FIG. 1 is a drawing showing the constitution of an embodiment of the present apparatus for treatment of semiconductor substrate with chemical solution.
Figure 2:
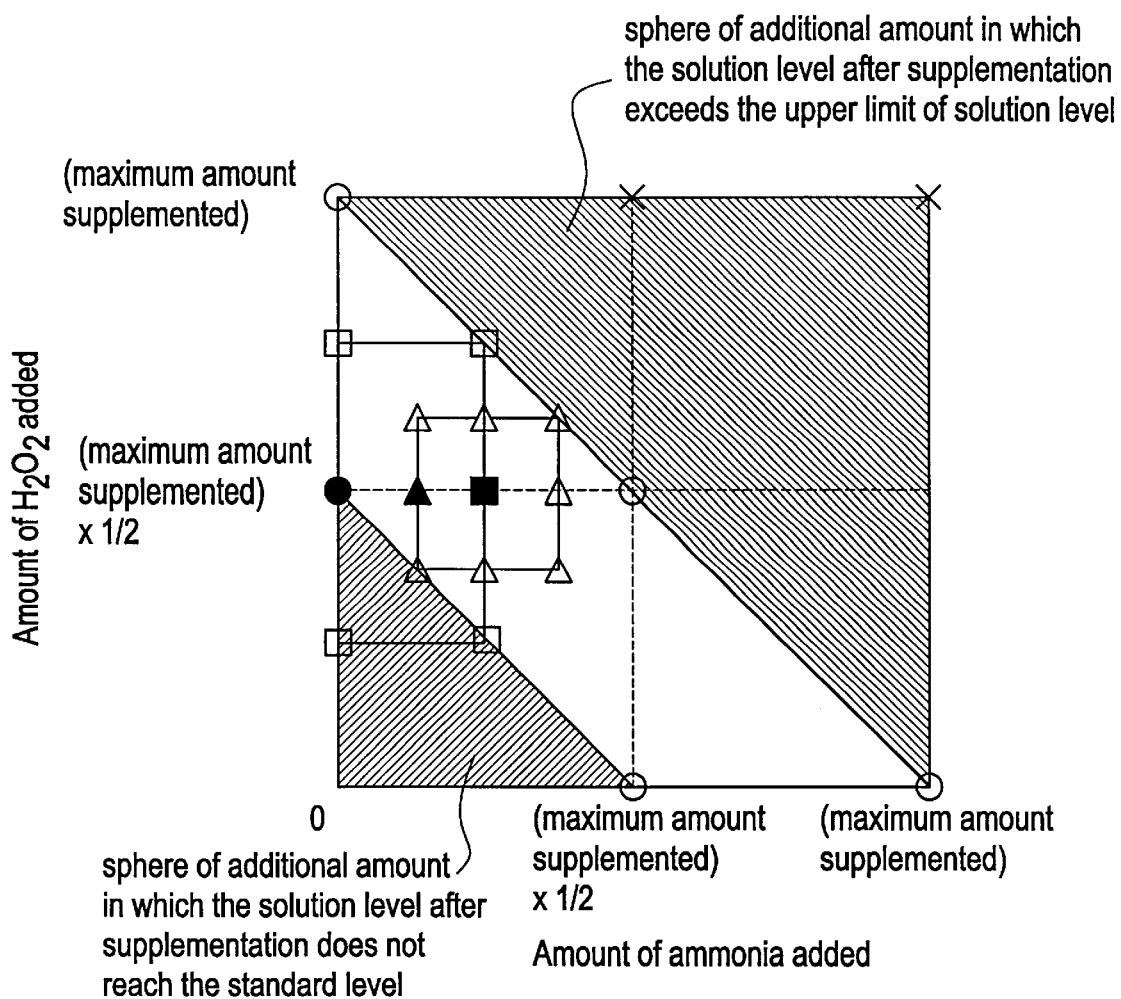
FIG. 2 is a conceptual drawing showing a means for determining the amounts of chemical solution components supplemented, in the present method for treatment of semiconductor substrate with chemical solution.
Figure 3:
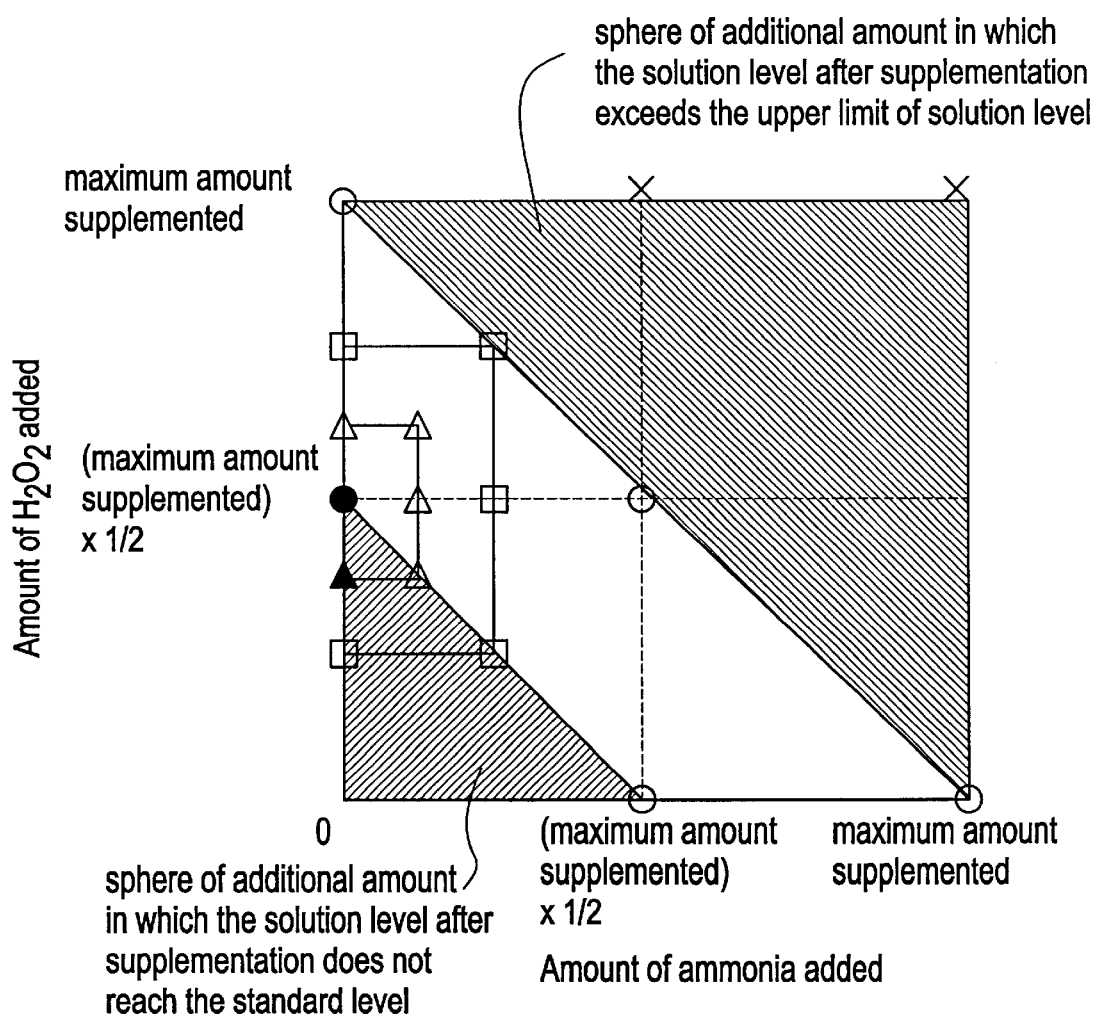
FIG. 3 is a conceptual drawing showing other means for determining the amounts of chemical solution components supplemented, in the present method for treatment of semiconductor substrate with chemical solution.

FIG. 1 is a drawing showing the constitution of an embodiment of the present apparatus for treatment of semiconductor substrate with chemical solution; FIG. 2 is a conceptual drawing showing a means for determining the amounts of chemical solution components supplemented, in the present method for treatment of semiconductor substrate with chemical solution; and FIG. 3 is a conceptual drawing showing other means for determining the amounts of chemical solution components supplemented, in the present method for treatment of semiconductor substrate with chemical solution.

In cleaning a semiconductor substrate by its immersion in a mixed chemical solution of ammonia and hydrogen peroxide, the cleaning ability of the chemical solution can be expressed by the etching rate of $SiO_2$ film (the etching rate is hereinafter indicated by dR/dt). Hence, an experiment is conducted in a system where the concentrations of chemical species in chemical solution are known, to experimentally determine, in advance, the rate (dR/dt) of the chemical reaction taking place in the treatment of a substrate with the chemical solution.

In the present apparatus for treatment of semiconductor substrate with chemical solution, shown in FIG. 1, the data-processing section (not shown in FIG. 1) has the following functions:

(1) a function of calculating the concentrations of chemical species from the data obtained by the measurement unit 11, (2) a function of conducting chemical equilibrium analysis from the concentrations of components of chemical solution to calculate the concentrations of chemical species, (3) a function of calculating the treating ability of current chemical solution in cleaning bath, from the reaction rate equation experimentally obtained above, (4) a function of calculating optimum amounts supplemented, based on the means (described later) for determining the amounts of chemical solution components supplemented, and (5) a function of controlling the amounts of chemical solution components and ultrapure water supplemented via feeding pumps 21, 23 and 25.

The measurement unit 12 measures the components which cause the deterioration of chemical solution, and includes a unit for measurement of metal concentrations, a unit for measurement of fine particles, a unit for measurement of carbon amount, etc. By using the data obtained by this measurement unit 12, as an indicator for total change of chemical solution, immersion of semiconductor substrate in inappropriate chemical solution can be prevented and improvements in yield and reliability of semiconductor device can be obtained.

Next, the means for determining optimum amounts supplemented is explained on a case of a mixed chemical solution of two components A and B. The difference between the current liquid level and the upper limit of liquid level is taken as the maximum amount supplemented when only one component is supplemented. The current liquid level is measured by the use of a liquid level sensor 6, and said maximum amount supplemented is calculated. For a case when the component A and the component B have been added each by an amount of $(1/n)^m$ times the maximum amount supplemented (n and m are each a natural number), the concentration of each chemical species after addition is calculated by chemical equilibrium analysis, and the surface-treating ability of chemical solution after supplementation is calculated from the above-mentioned reaction rate equation.

The means for determining the optimum amounts supplemented is described below in detail on a simple case of n=2, with reference to FIG. 2. In a first evaluation, the surface-treating ability of chemical solution is evaluated by the above-mentioned method on each of the cases when the amounts shown by the points ○ and ● of FIG. 2 have been supplemented. The thus-obtained surface-treating abilities of chemical solution after supplementation are compared with a predetermined value of surface-treating ability of chemical solution, stored in the data-processing section (i.e. a desired surface-treating ability of chemical solution) and with a predetermined range of said value (i.e. a desired variable range of said value). Incidentally, when the liquid level is not recovered to the standard liquid level after supplementation of solution components, ultrapure water is supplemented so that the liquid level is recovered to the standard level, after which the surface-treating ability of the resulting chemical solution is calculated. Then, a point is selected which gives a surface-treating ability of chemical solution closest to the predetermined value.

The thus-selected point is now assumed to be the point ●. In a second evaluation, the surface-treating ability of chemical solution is calculated on cases when (1) the point ● is taken as a central value, (2) an amount of $-(\frac{1}{2})^2$ times or $+(\frac{1}{2})^2$ times the maximum amount supplemented is added to the central value, and (3) each of the resulting amounts (amounts shown by points □ and ■) is supplemented. Based on the above calculation, a point is selected which gives a surface-treating ability of chemical solution closest to the predetermined value.

It is assumed that the point ■ has been selected in the second evaluation. Then, in a third evaluation, the surface-treating ability of chemical solution is calculated on cases when (1) the point ■ is taken as a central value, (2) an amount of $-(\frac{1}{2})^3$ times or $+(\frac{1}{2})^3$ times the maximum amount supplemented is added to the central value, and (3) each of the resulting amounts (amounts shown by points △ and ▲) is supplemented. Then, the same evaluation as in the first and second evaluation is made.

It is assumed that the point ▲ has been selected in the third evaluation. Then, this point is taken as a central value, and the same evaluation as made above is conducted. The times of evaluation suffices to be ordinarily the first to fourth evaluations in consideration of, for example, the metering accuracy of components of chemical solution.

Next, there is shown, in FIG. 3, the means for determining the amounts of components of chemical solution supplemented when minimization of component amounts supplemented is taken into account. The operation for evaluation of amounts supplemented is made in the same manner as in the operation of FIG. 2, i.e. the first evaluation, the second evaluation, the third evaluation, . . . . However, selection of each point is made so that the amounts of components supplemented become smallest within the predetermined range. Thereby, the surface-treating ability of chemical solution can be allowed to be within the allowable range and yet the amounts of components supplemented can be minimized. Incidentally, when the cost of chemical solution is important, a cost factor is added to the amounts of components supplemented.

Once the optimum amounts of components supplemented have been determined as above, each component and ultrapure water of required supplementation amounts are fed by pumps 21, 23 and 25.

Figure 4:
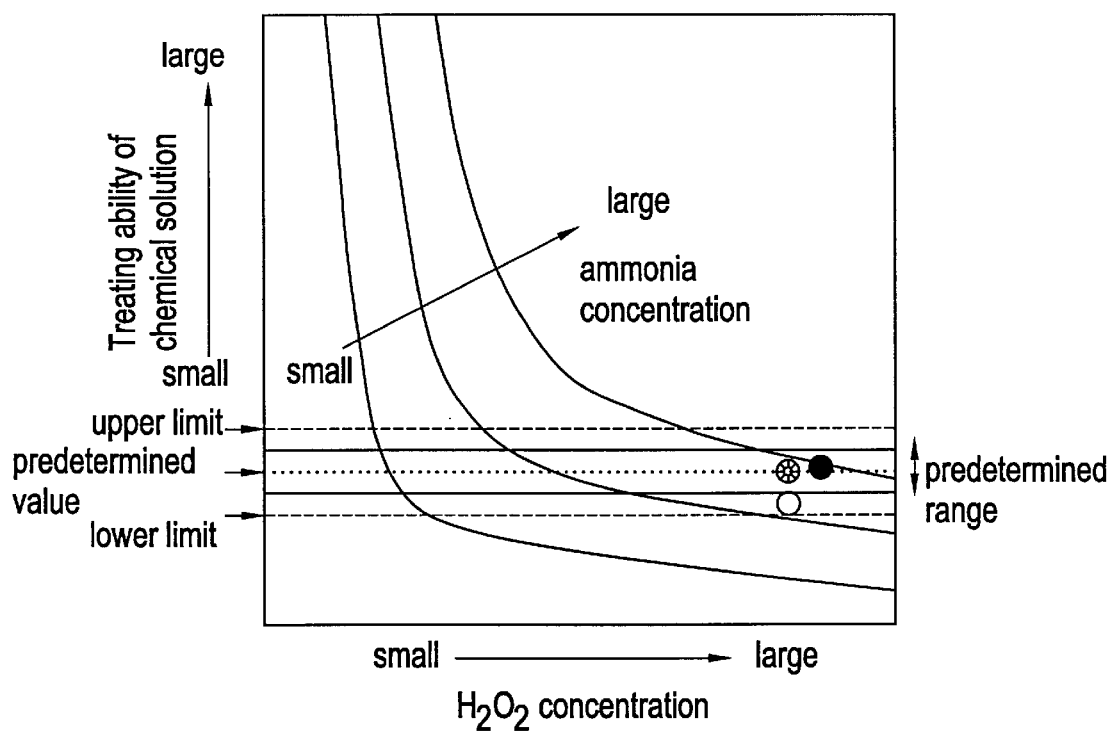
FIG. 4 is a drawing showing a relation of the composition of mixed chemical solution and the surface-treating ability of said solution.

The composition of chemical solution and the surface-treating ability of chemical solution do not always have a 1:1 correlation. For example, in a case of conducting surface treatment with a mixed chemical solution of component A (ammonia) and component B (hydrogen peroxide), the surface-treating ability of the chemical solution is as shown in FIG. 4, and a large number of component combinations have same surface treating ability. In such a case, reduction in amounts of solution components supplemented is made possible by (1) finding a composition of chemical solution which is close to the composition of current solution in cleaning bath and which gives a desired surface-treating ability and (2) conducting component supplementation so that such a composition is obtained, rather than by returning to the original composition. It is assumed that in FIG. 4, a point ● is a predetermined value of chemical solution composition and, with the lapse of time, the concentrations of component A and component B in chemical solution decrease and reach a point ○ right before supplementation. In such a case, the point ● was regained according to the normal method. Meanwhile, a point ⊙ has the same surface-treating ability as the point ● and can be reached with smaller amounts of components supplemented. Hence, in the present embodiment, supplementation is made so that the composition of chemical solution after supplementation becomes that of the point ⊙. Thereby, although the new composition of chemical solution is different from the original composition, the resulting surfacetreating ability is unchanged from the original ability. Such a means for determining the amounts of components supplemented is particularly effective when some of the components contained in chemical solution shows striking reduction in concentration with the lapse of time and the composition of chemical solution is difficult to maintain at a constant level.

(Second embodiment)

The second embodiment of the present invention is explained with reference to drawings.

Figure 5:
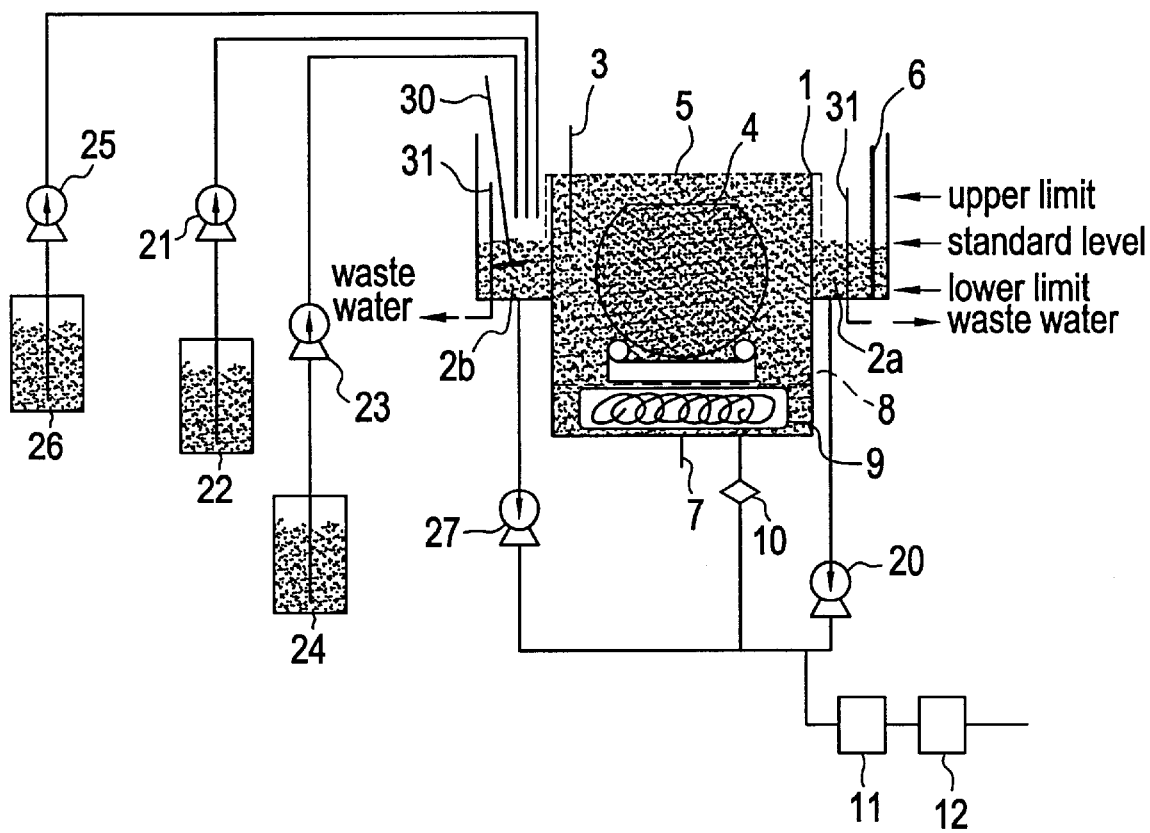
FIG. 5 is a drawing showing the constitution of other embodiment of the present apparatus for treatment of semiconductor substrate with chemical solution.
Figure 6:
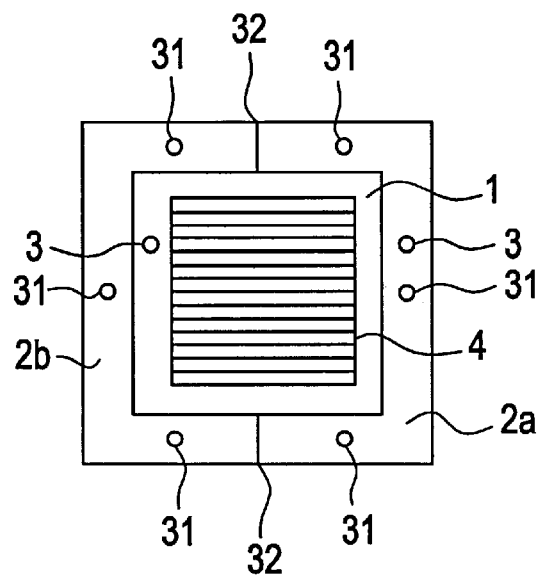
FIG. 6 is a top view of the chemical solution tank portion of the apparatus of FIG. 5 for treatment of semiconductor substrate with chemical solution.

FIG. 5 is a drawing showing the constitution of other embodiment of the present apparatus for treatment of semiconductor substrate with chemical solution; and FIG. 6 is a top view of the chemical solution tank portion of the apparatus of FIG. 5 for treatment of semiconductor substrate with chemical solution. Explanation is made below only on t he difference from the apparatus shown in FIG. 1.

An overflow bath is divided into two tanks (i.e. a circulating bath 2a and a mixing bath 2b) by a partition 32. The circulating bath 2a communicates with a circulating pump 20, and the mixing bath 2b communicates with a circulating pump 27. Part of the chemical solution in the circulating bath 2a is sent to measurement units 11 and 12 by the circulating pump 20. Based on the data obtained by the measurement unit 11 are calculated the concentrations of the chemical species present in the present chemical solution. Calculation of component amounts supplemented is made as described previously.

Once the optimum component amounts supplemented have been determined, the amounts of each component and ultrapure water supplemented are sent to the mixing bath 2b by the pumps 21, 23 and 25. The contents in the mixing bath 2b are mixed by a stirrer 30; the resulting mixed chemical solution is sent by the circulating pump 27 and merged with the chemical solution sent by the circulating pump 20; the resulting mixture is passed through a filter 10 and fed into a cleaning bath 1 for chemical solution. When the components of chemical solution supplemented are fed directly into the cleaning bath for chemical solution, nonuniformity of concentration takes place right after supplementation, in the cleaning bath and the overflow bath; a difference arises between the calculated concentration and the actual concentration; further, nonuniformity of treatment with chemical solution may take place between semiconductor substrates or on the surface of semiconductor substrate. In the present embodiment, however, the components supplemented are once mixed with the chemical solution before supplementation, in the mixing bath 2b; the resulting solution is mixed with the chemical solution sent from the circulating bath 2a by the circulating pump 20; the resulting mixture is passed through the filter 10 and fed into the cleaning bath 1 for chemical solution; therefore, the nonuniformity of concentration in cleaning bath, caused by supplementation is small and the above-mentioned problems caused by the nonuniformity of concentration of chemical solution appearing in the cleaning bath and the overflow bath can be eliminated.

EXAMPLE 1

The present invention is described in detail by way of Example with reference to drawings, on the mixed chemical solution of ammonia and hydrogen peroxide used for cleaning of semiconductor substrate in production of semiconductor device.

In FIG. 1, a chemical solution 5 for treatment of semiconductor substrate is a mixed chemical solution of ammonia and hydrogen peroxide. In a storage tank 22 is stored a commercial aqueous ammonia (29% by weight) for electronic industry; in a storage tank 24 is stored a commercial hydrogen peroxide (30% by weight) for electronic industry; and in a storage tank 26 is stored ultrapure water. The above mixed chemical solution is filled in a cleaning bath 1 for chemical solution and an overflow bath 2 right after the change of chemical solution, in such a way that when semiconductor substrates 4 are placed in the cleaning bath 1 for immersion, the chemical solution in the cleaning bath 1 flows out into the overflow bath 2 and fills the overflow bath 2 up to the standard level thereof. A measurement unit 11 is a monitoring unit for composition of chemical solution. A measurement unit 12 is a monitoring unit for metal impurities and, when the data obtained by this unit exceeds a predetermined value, the chemical solution in the cleaning bath and the overflow bath is changed totally irrespective of the cleaning ability of the chemical solution. The data obtained by the unit 11 and the data obtained by a temperature sensor 3 are used for calculation of cleaning ability (described later). The data obtained by a liquid level sensor 6 is used for calculation of amounts of components of chemical solution supplemented for maintenance of cleaning ability.

The chemical equilibrium of the mixed chemical solution is expressed by formulas (1) to (6). The formula (1) indicates the chemical equilibrium of dissociation of ammonia; the formula (2) indicates the chemical equilibrium of dissociation of hydrogen peroxide; and the formula (3) indicates the chemical equilibrium of dissociation of water. $K_a$ ($NH_4^+$), $K_a$ ($H_2O_2$) and $Kw$ are constants determined by temperature, i.e. equilibrium constants, and are expressed by a formula (7). In the formula (7), $\Delta H_0$ is a standard enthalpy of each reaction; $\Delta S_0$ is a standard entropy of each reaction; and T is an absolute temperature. Since the $\Delta H_0$ and $\Delta S_0$ of each reaction are known, when T is determined, the equilibrium constants of the formulas (1) to (3) can be calculated. The total concentrations of ammonia and hydrogen peroxide, i.e. $C_T(NH_3)$ and $C_T(H_2O_2)$ can be expressed each as a sum of the non-dissociating component and the dissociated component. A formula (6) indicates that in the solution, the total amount of cations is equal to the total amount of anions. Once the composition of chemical solution, i.e. $C_T(NH_3)$ and $C_T(H_2O_2)$ are determined, the concentrations of the chemical species in the mixed chemical solution, i.e. $NH_3$, $NH_4^+$, $H_2O_2$, $HO_2^-$, $H^+$ and $OH^-$ can be calculated by solving the formulas (1) to (6).

$$NH_4^+ \rightleftharpoons NH_3 + H^+ \quad [NH_3][H^+]/[NH_4^+] = K_a(NH_4^+) \tag{1}$$

$$H_2O_2 \rightleftharpoons HO_2^- + H^+ \quad [HO_2^-][H^+]/[H_2O_2] = K_a(H_2O_2) \tag{2}$$

$$H_2O \rightleftharpoons OH^- + H^+ \quad [OH^-][H^+] = K_W \tag{3}$$

$$C_T(NH_3) = [NH_3] + [NH_4^+] \tag{4}$$

$$C_T(H_2O_2) = [H_2O_2] + [HO_2^-] \tag{5}$$

$$[NH_4^+] + [H^+] = [HO_2^-] + [OH^-] \tag{6}$$

$$-RT \ln K = \Delta G^0 = \Delta H^0 - T\Delta S^0 \tag{7}$$

$$dR/dt = k_1[OH^-]^{n1} + k_2[HO_2^-]^{n2} + k_3[H_2O_2]^{n3} + k_4[NH_3]^{n4} + k_5[H^+]^{n5} + k_6[NH_4^+]^{n6} + k_7[Si(OH)_3O^-]^{n7} \tag{8}$$

[ ]: concentration of chemical species $k_1=f_1(T, S)$, $k_2=f_2(T, S)$, . . . , $k_m=f_m(T,S)$ T: temperature of treating chemical solution S: property of material to be treated A function of calculating the concentrations of chemical species is possessed by a data-processing section (not shown in FIG. 1). Also in the data-processing section is stored a relation between concentrations of chemical species and cleaning ability, for the semiconductor substrate to be cleaned, and the data-processing section can calculate the cleaning ability of chemical solution when necessary, from the concentrations of chemical species obtained by the above-mentioned function of calculating said concentrations. In the data-processing section is stored, for example, the relation of FIG. 7 experimentally obtained with respect to the etching rate of semiconductor substrate surface.

In FIG. 7, a/b was 200 when the substrate surface was a thermally formed oxide film, and was 1,000 when the substrate surface was a native oxide film or a Si substrate per se. The concentrations of chemical species other than $OH^-$ and $HO_2^-$ have effects as well on the cleaning ability of chemical solution, and it is desirable that the cleaning ability is evaluated from an overall standpoint. A formula (8) was developed as a formula for overall evaluation. In the formula (8), the term of OH⁻ concentration and the term of $HO_2^-$ concentration have each a large influence; and the relation of FIG. 7 was obtained experimentally. When the OH⁻ concentration was set at 0.0005 mol/l and the $HO_2^-$ concentration was set at 0.05 mol/l or higher, the fine particles on semiconductor substrate surface could be removed completely in a five-minute treatment in all cases when the substrate surface was a thermally formed oxide film, a native oxide film or a silicon substrate per se. Since excessive etching deteriorates the properties of semiconductor device, the OH⁻ concentration was set at 0.00055 mol/l, the predetermined range thereof was set at ±2%, the lower limit thereof was set at 0.0005 mol/l, the upper limit thereof was set at 0.0006 mol/l, and control of composition of chemical solution was conducted using the relation of FIG. 7. By utilizing the relation of FIG. 4, the initial $NH_3$ concentration was set at 1.0 mol/l and the initial $H_2O_2$ concentration was set at 1.7 mol/l (point ● in FIG. 4).

OH⁻ concentration and $HO_2^-$ concentration are calculated from the data obtained by the measurement unit 11 and also from the data obtained by the temperature sensor 3; from the thus-obtained concentrations is calculated the surface-treating ability of chemical solution. When the calculated ability exceeds a predetermined range, optimum amounts of components supplied are determined according to the means for determining said optimum amounts, shown in FIG. 2, as described in detail in the first embodiment, and necessary amounts of components and ultrapure water supplemented were sent by pumps 21, 23 and 25. Supplementation of components and ultrapure water in this way was conducted up to the time when the concentration of impurities in chemical solution, obtained by the measurement unit 12 exceeded a predetermined value.

Specifically explaining, $NH_3$ decreased by vaporization during the treatment of substrate surface and $H_2O_2$ showed no substantial decrease; the $NH_3$ concentration became 0.96 mol/l and the concentration of $H_2O_2$ became 1.7 mol/l (point ○ in FIG. 4); and the surface-treating ability of chemical solution decreased by about 3%. Then, amounts to be supplemented were determined based on the means for determining optimum amounts supplemented, described in the first embodiment; and the treating ability was recovered. After the supplementation, the $NH_3$ concentration was 0.98 mol/l and the $H_2O_2$ concentration was 1.67 mol/l. The amounts supplemented was ½ as compared with when the initial concentrations were regained by supplementation, that is, the $NH_3$ concentration was returned to 1.0 mol/l and the $H_2O_2$ concentration was returned to 1.7 mol/l. Hydrogen peroxide was not supplemented, and only ammonia and ultrapure water were supplemented.

Figure 8:
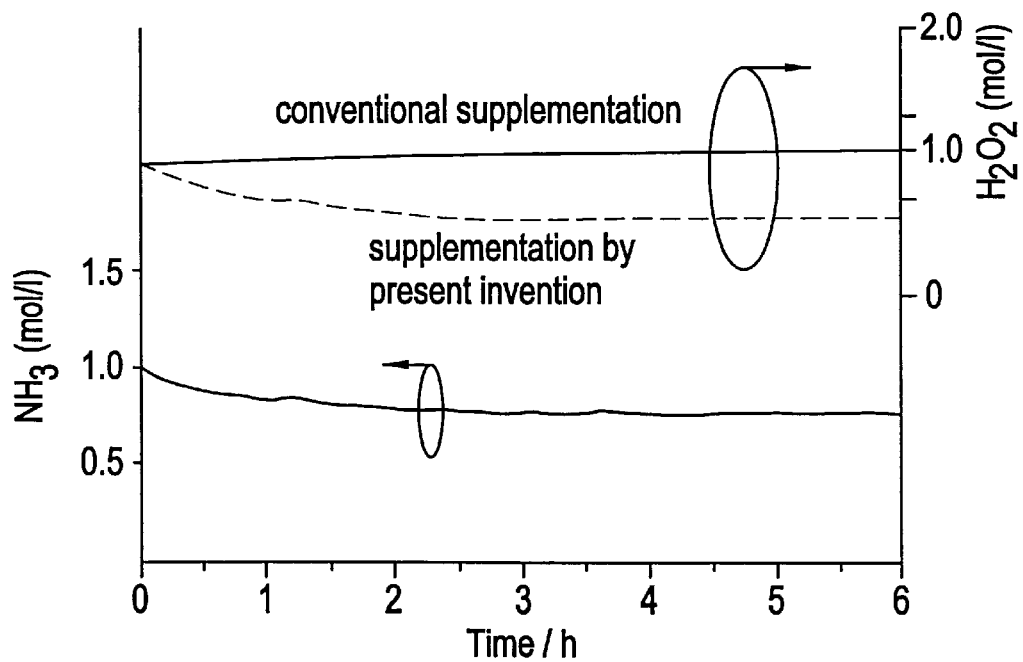
FIG. 8 is a drawing showing a case of application of the present invention to cleaning of semiconductor substrate with ammonia-hydrogen peroxide mixed solution.
Figure 9:
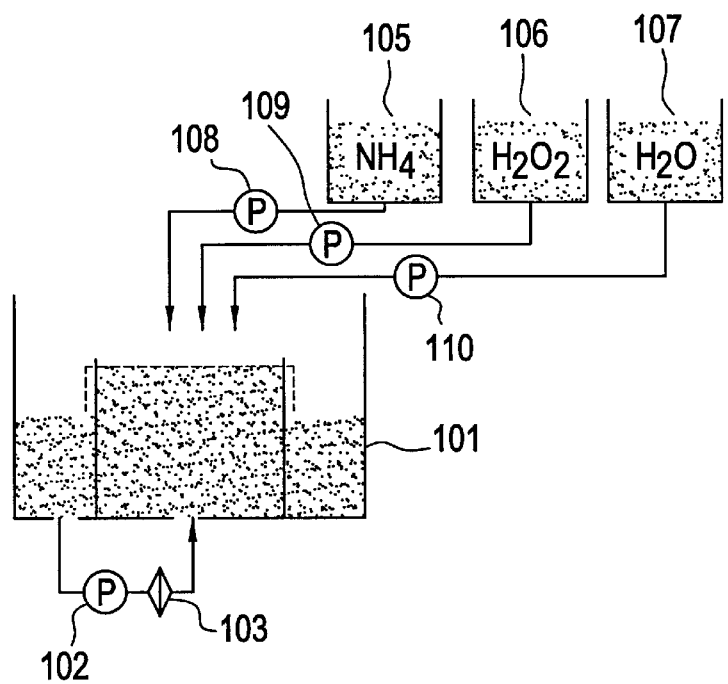
FIG. 9 is a drawing showing the constitution of an apparatus used for a conventional method for treatment of semiconductor substrate with chemical solution.
Figure 10:
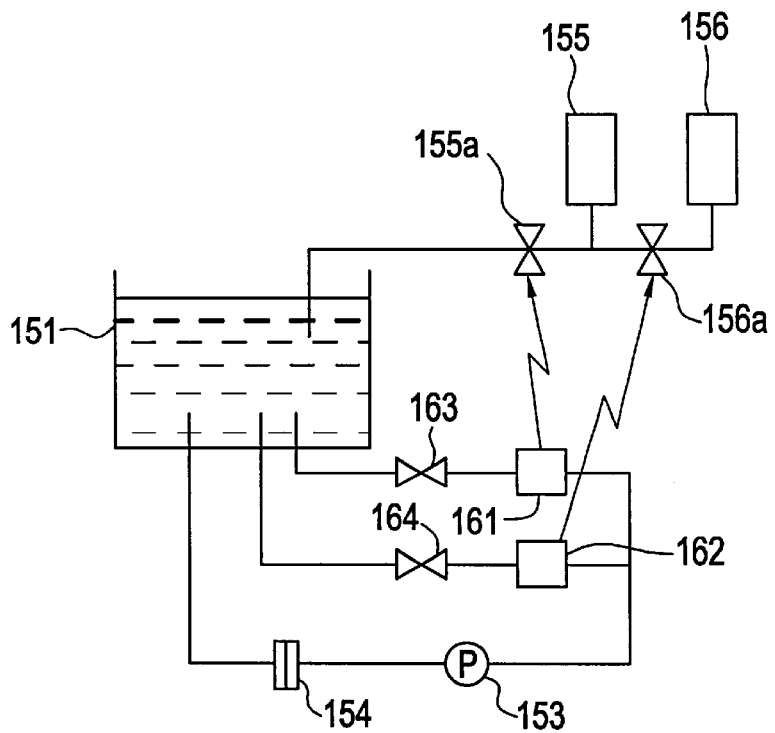
FIG. 10 is a drawing showing the constitution of other apparatus used for a conventional method for treatment of semiconductor substrate with chemical solution.

When a mixed chemical solution of ammonia and hydrogen peroxide is used, reduction in ammonia concentration due to vaporization of ammonia is generally larger than reduction in hydrogen peroxide concentration caused by decomposition of hydrogen peroxide, and ammonia concentration tends to decrease even after its supplementation. Therefore, by finding, by calculation, a composition of chemical solution which gives a desired cleaning ability and which is closest to the composition of current chemical solution in cleaning bath and by supplementing necessary amounts of components and ultrapure water, the maintenance of cleaning ability is possible although the concentrations of components in chemical solution vary with the lapse of time as shown in FIG. 8. This mode of supplementation, as compared with the conventional supplementation mode of maintaining the original composition of chemical solution, can stabilize the cleaning ability of chemical solution and moreover can reduce the amounts of components supplemented.

In the present Example, the cleaning apparatus of FIG. 1 was used. When the apparatus of FIG. 5 is used, advantages mentioned in the second embodiment can be obtained, that is, the nonuniformity of concentration in cleaning bath, caused by supplementation is small, the stability of cleaning ability is enhanced, and the previously-mentioned problems arising from the concentration nonuniformity in cleaning bath and overflow bath can be eliminated.

What is claimed is:

1. An apparatus for surface treatment of semiconductor substrate with chemical solution, having:

a cleaning bath in which a semiconductor substrate is placed and treated with a chemical solution, and an overflow bath provided so as to surround the cleaning bath, wherein the overflow bath has a circulating bath and a mixing bath; the circulating bath communicates with a first circulating pump; the mixing bath is fitted with pipes for feeding a predetermined components of chemical solution effective for surface treatment and also fitted with a pipe for feeding ultrapure water; the mixing bath communicates with a second circulating pump; a filter for removal of fine particles is provided downstream of a site at which an outlet side of the first circulating pump and an outlet side of the second circulating pump merge; and the first circulating pump and the second circulating pump feed the predetermined components of chemical solution into the cleaning bath.

2. An apparatus for surface treatment of semiconductor substrate with chemical solution according to claim 1, wherein the mixing bath has a stirrer.

3. An apparatus for surface treatment of semiconductor substrate with chemical solution according to claim 1, which further has:

a unit for measuring components causing the deterioration of the chemical solution, and a means for determining timing of a total change of the chemical solution based on result of the measurement made by the unit.

4. An apparatus for surface treatment of semiconductor substrate with chemical solution according to claim 3, wherein the unit measures the concentrations of metals, or fine particles, or the amount of carbon.

* * * * *